United States Patent
Lopatin et al.

(10) Patent No.: US 7,256,111 B2
(45) Date of Patent: Aug. 14, 2007

(54) PRETREATMENT FOR ELECTROLESS DEPOSITION

(75) Inventors: Sergey Lopatin, Santa Clara, CA (US); Arulkumar Shanmugasundram, Sunnyvale, CA (US); Ramin Emami, San Jose, CA (US); Hongbin Fang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 286 days.

(21) Appl. No.: 10/934,850

(22) Filed: Sep. 3, 2004

(65) Prior Publication Data

US 2005/0164497 A1   Jul. 28, 2005

Related U.S. Application Data

(60) Provisional application No. 60/539,449, filed on Jan. 26, 2004.

(51) Int. Cl.
*H01L 21/26* (2006.01)
*H01L 21/42* (2006.01)

(52) U.S. Cl. ............ 438/513; 438/474; 438/475; 438/678; 438/680; 257/E21.17; 257/E21.218; 257/E21.229; 257/E21.319

(58) Field of Classification Search ........ 438/678, 438/474, 475, 513, 901, 905, 680, 683, 685, 438/660, 663, 648, 706, 745
See application file for complete search history.

(56) References Cited

U.S. PATENT DOCUMENTS

| | | | |
|---|---|---|---|
| 3,403,035 A | 9/1968 | Schneble et al. | |
| 3,745,039 A | 7/1973 | Feldstein et al. | |
| 4,717,591 A | 1/1988 | Acosta et al. | |
| 5,169,680 A | 12/1992 | Ting et al. | |
| 5,380,560 A | 1/1995 | Kaja et al. | |
| 5,674,787 A | 10/1997 | Zhao et al. | |
| 5,695,810 A * | 12/1997 | Dubin et al. | 438/678 |
| 5,755,859 A | 5/1998 | Brusic et al. | |
| 5,824,599 A | 10/1998 | Shacham-Diamand et al. | |
| 5,830,805 A | 11/1998 | Shacham-Diamand et al. | |
| 5,891,513 A | 4/1999 | Dubin et al. | |
| 6,100,184 A | 8/2000 | Zhao et al. | |

(Continued)

FOREIGN PATENT DOCUMENTS

WO    WO 88/08887    11/1988

OTHER PUBLICATIONS

Chen, et al., US Patent Application "Method and Apparatus For Annealing Copper Films", U.S. Appl. No. 09/513,734, filed Feb. 18, 2000.

(Continued)

*Primary Examiner*—David Nhu
(74) *Attorney, Agent, or Firm*—Patterson & Sheridan, LLP

(57) ABSTRACT

Embodiments of the present invention relate to an apparatus and method of annealing substrates in a thermal anneal chamber and/or a plasma anneal chamber before electroless deposition thereover. In one embodiment, annealing in a thermal anneal chamber includes heating the substrate in a vacuum environment while providing a gas, such as noble gases, hydrogen gas, other reducing gases, nitrogen gas, other non-reactive gases, and combinations thereof. In another embodiment, annealing in a plasma chamber comprises plasma annealing the substrate in a plasma, such as a plasma from an argon gas, helium gas, hydrogen gas, and combinations thereof.

19 Claims, 7 Drawing Sheets

U.S. PATENT DOCUMENTS

| | | | |
|---|---|---|---|
| 6,136,163 A | 10/2000 | Cheung et al. | |
| 6,144,099 A | 11/2000 | Lopatin et al. | |
| 6,165,912 A | 12/2000 | McConnell et al. | |
| 6,187,152 B1 | 2/2001 | Ting et al. | |
| 6,197,364 B1 | 3/2001 | Paunovic et al. | |
| 6,258,223 B1 | 7/2001 | Cheung et al. | |
| 6,261,637 B1 | 7/2001 | Oberle | |
| 6,291,082 B1 * | 9/2001 | Lopatin | 428/621 |
| 6,297,147 B1 | 10/2001 | Yang et al. | |
| 6,342,733 B1 | 1/2002 | Hu et al. | |
| 6,344,410 B1 | 2/2002 | Lopatin et al. | |
| 6,365,025 B1 | 4/2002 | Ting et al. | |
| 6,436,267 B1 | 8/2002 | Carl et al. | |
| 6,528,409 B1 * | 3/2003 | Lopatin et al. | 438/618 |
| 6,616,967 B1 | 9/2003 | Test | |
| 6,645,550 B1 | 11/2003 | Cheung et al. | |
| 6,645,567 B2 | 11/2003 | Chebiam et al. | |
| 6,680,540 B2 | 1/2004 | Nakano et al. | |
| 6,717,189 B2 | 4/2004 | Inoue et al. | |
| 6,740,221 B2 | 5/2004 | Cheung et al. | |
| 6,818,066 B2 * | 11/2004 | Cheung | 118/715 |
| 6,824,612 B2 | 11/2004 | Stevens et al. | |
| 6,824,666 B2 | 11/2004 | Gandikota et al. | |
| 2001/0030366 A1 | 10/2001 | Nakano et al. | |
| 2001/0055934 A1 | 12/2001 | Cheung | |
| 2002/0043466 A1 | 4/2002 | Dordi et al. | |
| 2002/0098681 A1 | 7/2002 | Hu et al. | |
| 2002/0098711 A1 | 7/2002 | Klein | |
| 2002/0152955 A1 | 10/2002 | Dordi et al. | |
| 2003/0010645 A1 | 1/2003 | Ting et al. | |
| 2003/0075808 A1 | 4/2003 | Inoue et al. | |
| 2003/0113576 A1 | 6/2003 | Chebiam et al. | |
| 2003/0118732 A1 | 6/2003 | Stevens et al. | |
| 2003/0127336 A1 | 7/2003 | Cohen et al. | |
| 2003/0139942 A1 | 7/2003 | Rakshit et al. | |
| 2003/0140988 A1 | 7/2003 | Gandikota et al. | |
| 2003/0141018 A1 | 7/2003 | Stevens et al. | |
| 2003/0181040 A1 | 9/2003 | Ivanov et al. | |
| 2003/0189026 A1 | 10/2003 | Padhi et al. | |
| 2003/0190426 A1 | 10/2003 | Padhi et al. | |
| 2003/0190812 A1 | 10/2003 | Padhi et al. | |
| 2003/0194872 A1 | 10/2003 | Parikh et al. | |
| 2003/0235983 A1 | 12/2003 | Li et al. | |
| 2004/0003873 A1 | 1/2004 | Chen et al. | |
| 2004/0035316 A1 | 2/2004 | Chebiam et al. | |
| 2004/0038073 A1 | 2/2004 | Chebiam et al. | |
| 2004/0052963 A1 | 3/2004 | Ivanov et al. | |
| 2004/0065540 A1 | 4/2004 | Mayer et al. | |
| 2004/0084141 A1 | 5/2004 | Czaplicki | |
| 2004/0084143 A1 | 5/2004 | Ivanov et al. | |
| 2004/0094087 A1 | 5/2004 | Ivanov et al. | |
| 2004/0094186 A1 | 5/2004 | Ivanov | |
| 2004/0096592 A1 | 5/2004 | Chebiam et al. | |
| 2004/0097071 A1 | 5/2004 | Ivanov | |
| 2004/0112756 A1 | 6/2004 | Boyd et al. | |
| 2004/0134375 A1 | 7/2004 | Kolics et al. | |
| 2004/0154185 A1 | 8/2004 | Morad et al. | |
| 2004/0175509 A1 | 9/2004 | Kolics et al. | |
| 2004/0201041 A1 | 10/2004 | Madok et al. | |
| 2004/0262772 A1 | 12/2004 | Ramanathan et al. | |
| 2005/0090098 A1 | 4/2005 | Dubin et al. | |

OTHER PUBLICATIONS

Partial International Search Report dated Apr. 6, 2005 regarding International Application No. PCT/US2004/034044.

Partial International Search Report dated Apr. 6, 2005 regarding International Application No. PCT/US2004/034449.

Dubin, et al., *Selective and Blanket Electroless Copper Deposition for Ultralarge Scale Integration*, J Electrochem. Soc., vol. 144, No. 3, Mar. 1997, The Electrochemical Society, Inc., pp. 898-908.

Hu, et al.; "*Reduced electromigration of Cu wires by surface coating*", American Institute of Physics, vol. 81, No. 10, Sep. 2, 2002; pp. 1782-1784.

Shacham-Diamand, et al.; "*Copper electroless deposition technology for ultra-large-scale-integration (ULSI) metallization*", Microelectronic Engineering 33 (1997) pp. 47-58.

Shacham-Diamand, et al.; "*High aspect ratio quarter-micron electroless copper integrated technology*", Microelectronic Engineering 37/38 (1997) pp. 77-88.

Shacham-Diamand, et al.; "*Integrated electroless metallization for ULSI*", Electrochimica Acta 44 (1999) pp. 3639-3649.

Ting, et al.; "*Selective Electroless Metal Deposition for Via Hole Filling in VLSI Multilevel Interconnection Structures*", J Electrochem. Soc., vol. 136, No. 2, Feb. 1989, The Electrochemical Society, Inc., pp. 462-466.

* cited by examiner

PRETREATMENT FOR ELECTROLESS DEPOSITION

CROSS-REFERENCE TO RELATED APPLICATIONS

This application claims benefit of U.S. provisional patent application Ser. No. 60/539,449, filed Jan. 26, 2004, which is herein incorporated by reference.

BACKGROUND OF THE INVENTION

1. Field of the Invention

Embodiments of the present invention generally relate to an apparatus and method of pretreatment of substrates before electroless deposition thereover. More specifically, embodiments of the present invention relate to an apparatus and method of annealing substrates in a thermal anneal chamber and/or a plasma anneal chamber before electroless deposition thereover.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Many traditional deposition processes have difficulty filling sub-micron structures where the aspect ratio exceeds 2:1, and particularly where the aspect ratio exceeds 4:1. Therefore, there is a great amount of ongoing effort being directed at the formation of substantially void-free, sub-micron features having high aspect ratios.

Electroless deposition has emerged as a promising process for depositing metal layers, such as for depositing capping layers, for depositing seed layers, for filling of sub-quarter micron sized high aspect ratio interconnect features, and for forming other metal layers. Electroless deposition involves an autocatalyzed chemical deposition process that does not require an applied current for the reaction to occur. Electroless deposition typically involves exposing a substrate to a solution by immersing the substrate in a bath or by spraying the solution over the substrate.

However, prior electroless deposition processing apparatuses and methods have faced substantial challenges in accurately controlling the electroless deposition process and the defect ratios in the resulting deposition layers. Thus, there is a need for improved electroless deposition apparatuses and methods capable of depositing controlled uniform layers having minimal defects.

SUMMARY OF THE INVENTION

Embodiments of the present invention relate to an apparatus and method of annealing substrates in a thermal anneal chamber and/or a plasma anneal chamber before electroless deposition thereover. In one embodiment, annealing in a thermal anneal chamber comprises heating the substrate in a vacuum environment while providing a gas, such as a noble gas, a reducing gas such as hydrogen gas, a non-reducing gas such as nitrogen gas, or combinations thereof. In another embodiment, annealing in a plasma chamber comprises plasma annealing the substrate in a plasma, such as a plasma from an argon gas, helium gas, hydrogen gas, or combinations thereof.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
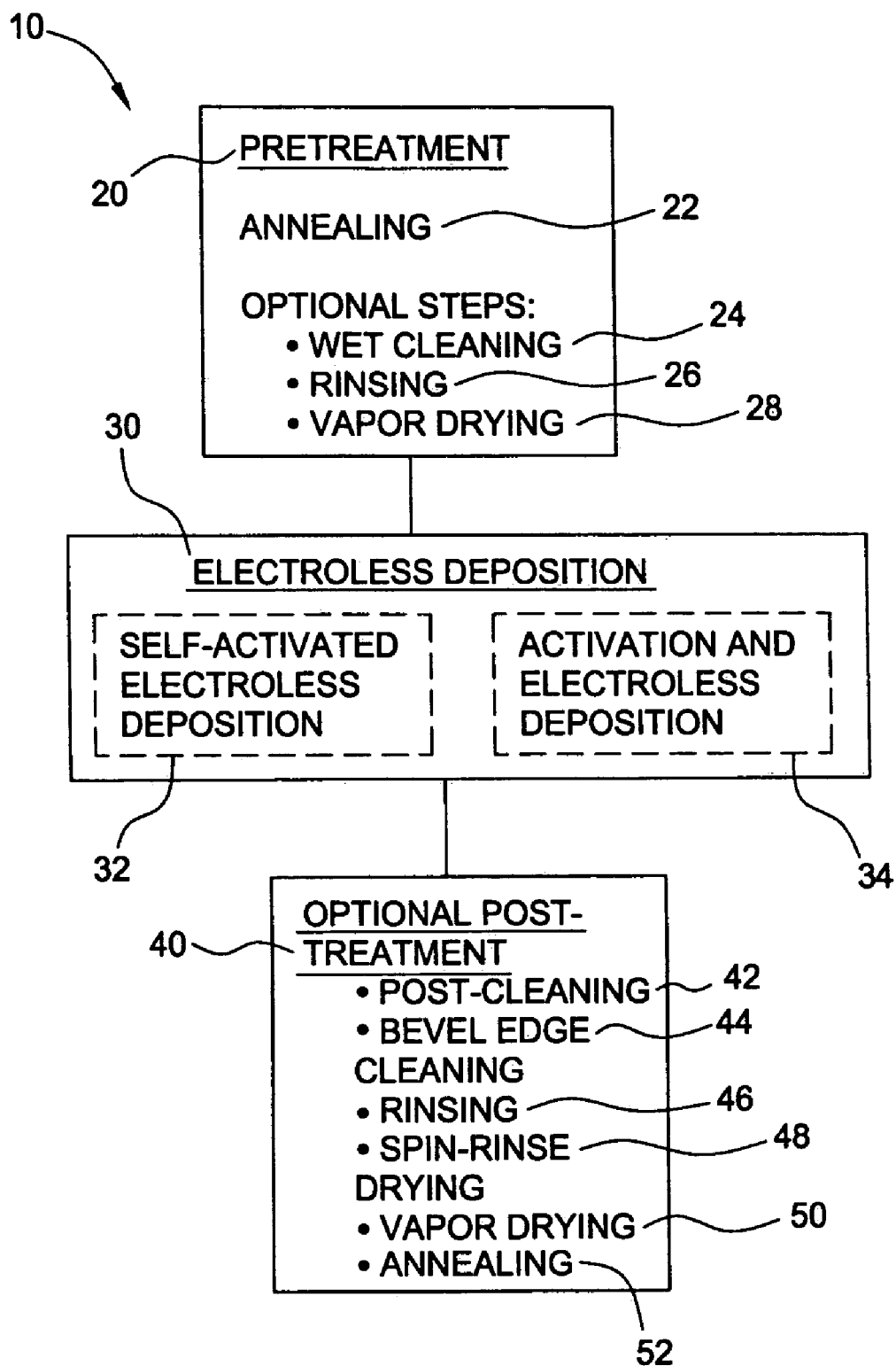
FIG. 1 is a schematic flow chart of one example of a method of annealing a substrate before electroless deposition thereover.

Embodiments of the present invention relate to an apparatus and method of annealing substrates in a thermal anneal chamber and/or a plasma anneal chamber before electroless deposition thereover. FIG. 1 is a schematic flow chart of one example of a method 10 of annealing a substrate before electroless deposition thereover. The method 10 includes a pretreatment process 20. Pretreatment process 20 includes an annealing step 22 in which a substrate, such as a semiconductor substrate or a glass substrate, is annealed in a thermal anneal chamber and/or is annealed in a plasma anneal chamber. The pretreatment process 20 may also include one or more optional steps such as a wet cleaning step 24, a rinsing step 26, a vapor drying step 28, or other steps performed before an electroless deposition process 30. One example of a pretreatment process 20 including optional steps that may be used to advantage is a wet megasonic clean, a vapor dry, an anneal, and then, a copper clean.

An electroless deposition process 30 is performed after the pretreatment process 20. The electroless deposition process 30 may comprise a self-activated electroless deposition process 32. Alternatively, the electroless deposition process may comprise an activated electroless deposition process 34 including activating the substrate and then electroless depositing material over the activated substrate. Further details concerning electroless deposition are disclosed in commonly assigned U.S. Pat. No. 6,258,223, entitled "IN-SITU ELECTROLESS COPPER SEED LAYER ENHANCEMENT IN AN ELECTROPLATING SYSTEM," issued Jul. 10, 2001, which is herein incorporated by reference in its entirety to the extent not inconsistent herewith.

An optional post-treatment process 40 may be performed after the electroless deposition process 30. The optional post-treatment process 40 may include one or more optional steps such as a post-cleaning step 42, a bevel edge cleaning step 44, rinsing step 46, a spin-rinse drying step 48, a vapor drying step 50, an annealing step 52, and/or other steps.

The method 10 may be performed in multiple chambers and platforms or may be performed in an integrated processing platform. The method 10 is preferably performed in an integrated processing platform to reduce the likelihood of contamination of the substrate between processing steps.

Figure 2:
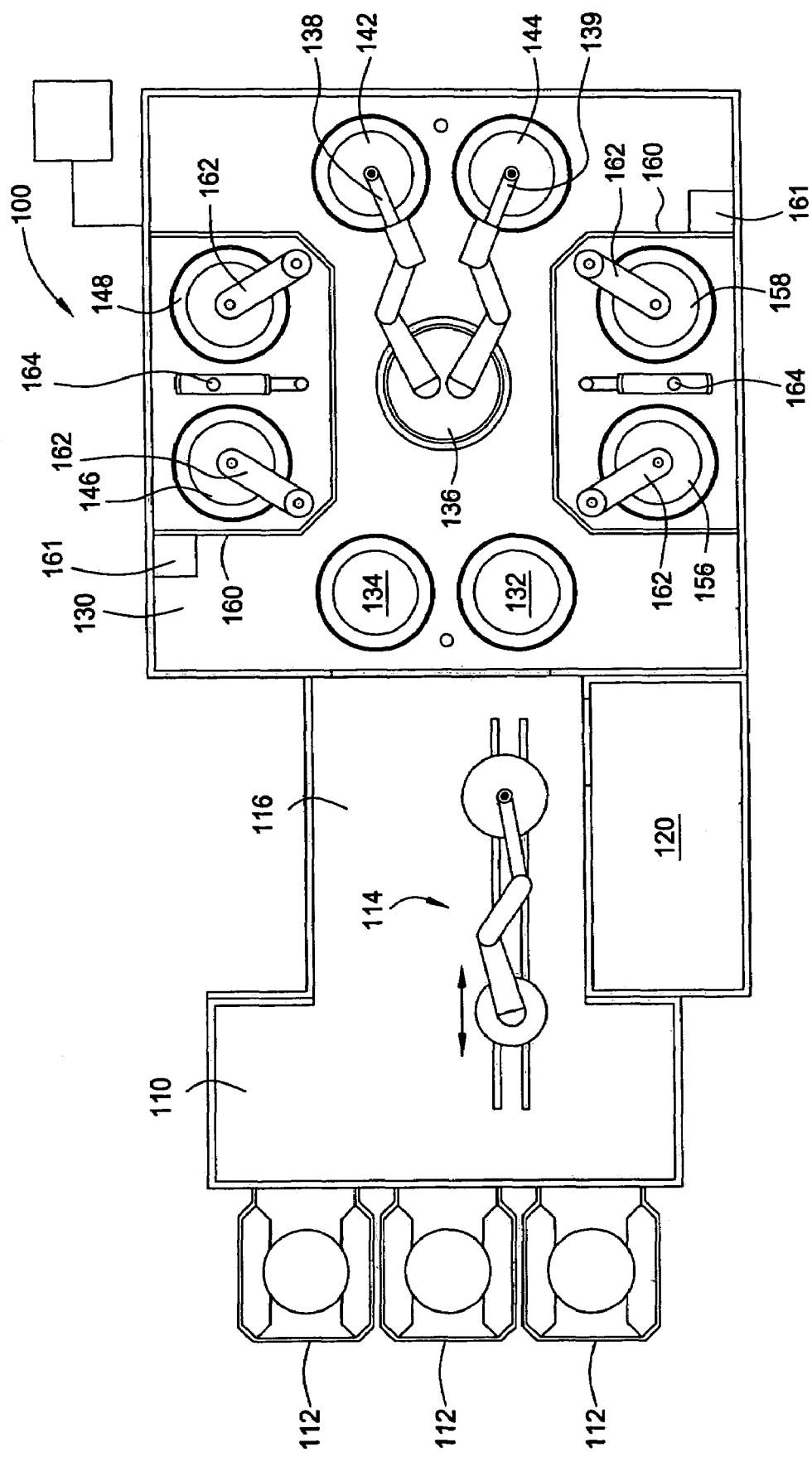
FIG. 2 is a schematic top view of one embodiment of an integrated processing system.

FIG. 2 is a schematic top view of one embodiment of an integrated processing system 100 which may be used to perform the method 10 of FIG. 1. System 100 includes a factory interface 110. Factory interface 110 includes a plurality of substrate loading stations 112 configured to interface with substrate containing cassettes (not shown). A robot 114 is generally positioned in factory interface 110 and is configured to access substrates contained in cassettes positioned on the loading stations 112. Further, robot 114 also extends into a link tunnel 116 that connects factory interface 110 to processing mainframe 130. The robot 114 can transfer substrates between the loading stations 112, an anneal chamber 120, and processing cells 132, 134 of mainframe 130.

The factory interface 110 may also include a metrology inspection station (not shown), which may be used to inspect substrates before and/or after a processing step. The metrology inspection station may be used, for example, to analyze the characteristics, e.g., thickness, planarity, grain structure, etc., of plated materials on the substrate. Exemplary metrology inspection stations that may be used include the BX-30 Advanced Interconnect Measurement System, and CD-SEM or DR-SEM inspection stations, all of which are commercially available from Applied Materials, Inc. of Santa Clara, Calif.

The anneal chamber 120 may comprise a thermal anneal chamber and/or may comprise a plasma anneal chamber. Although the anneal chamber 120 is illustrated as being positioned such that it is accessed from the link tunnel 116, embodiments of the invention are not limited to any particular configuration or placement. As such, the anneal chamber 120 may be positioned in direct communication with the mainframe 130, i.e., accessed by a mainframe robot 136, or alternatively, the anneal chamber 120 may be positioned in communication with the mainframe 130, i.e., the anneal chamber may be positioned on the same system as mainframe 130, but may not be in direct contact with the mainframe 130 or accessible from the mainframe robot 136.

The mainframe robot 136 generally includes one or more arms/blades 138, 139 configured to support and transfer substrates between processing cells 132, 134, 142, 144, 146, 148, 156, 158. Generally, process cells 132, 134, 142, 144, 146, 148, 156, 158 may be any number of processing cells utilized in a substrate processing system. More particularly, each process cell may be configured to perform one or a combination of processes such as wet cleaning, vapor drying, electroless deposition, activation, rinsing, bevel cleaning, spin-rinse drying, metrology inspection, electroplating, and/or other processes that may be beneficially used in conjunction with an electrochemical processing platform. Each cell may process substrates either in a horizontal configuration face-up, in a horizontal configuration face-down, or in a vertical configuration.

Mainframe 130 of platform 100 may also include a fluid deposition processing enclosure 160 positioned to enclose cells 146, 148 and cells 156, 158. The processing enclosure 160 includes a processing gas source 161 positioned in fluid communication therewith configured to provide a processing gas to the interior of enclosure 160. More particularly, the gas source 161 may be configured to provide a noble gas, such as nitrogen, helium, argon, or other gas commonly used in semiconductor processing, to the interior of the processing enclosure 160. As such, the gas source 161 essentially operates to flood the interior of processing enclosure 160 with a noble gas, thus purging the interior of processing enclosure 160 of gases that may degrade the electroless deposition process, such as oxygen, for example.

Mainframe 130 may also include head assemblies 162 positionable over one or more processing cells. For example, each cell 146, 148, 156, and 158 may have a dedicated head assembly to only service that particular cell. In another example, a head assembly may be provided to service two or more cells. The mainframe 130 may also include a substrate shuttle 164 to transfer substrates between each pair of cells 146, 148 and cells 156, 158.

One example of the mainframe 130 of platform 100 may be configured as follows. Processing cells 132, 134 may be configured as an interface between the mainframe 130 and the link tunnel 116. The processing cells 132, 134 located at the interface may be spin-rinse dry cells and/or substrate cleaning cells, for example. Processing cells 142, 144 may be configured as bevel cleaning cells, i.e., cells configured to remove excess deposition from the perimeter of a substrate after a deposition process has been completed. Cells 146, 148, 156, and 158 may be configured as electroless deposition or electroless deposition support cells, e.g., electroplating cells, electroless deposition cells, activation cells, and/or substrate rinse or clean cells, for example.

Figure 3:
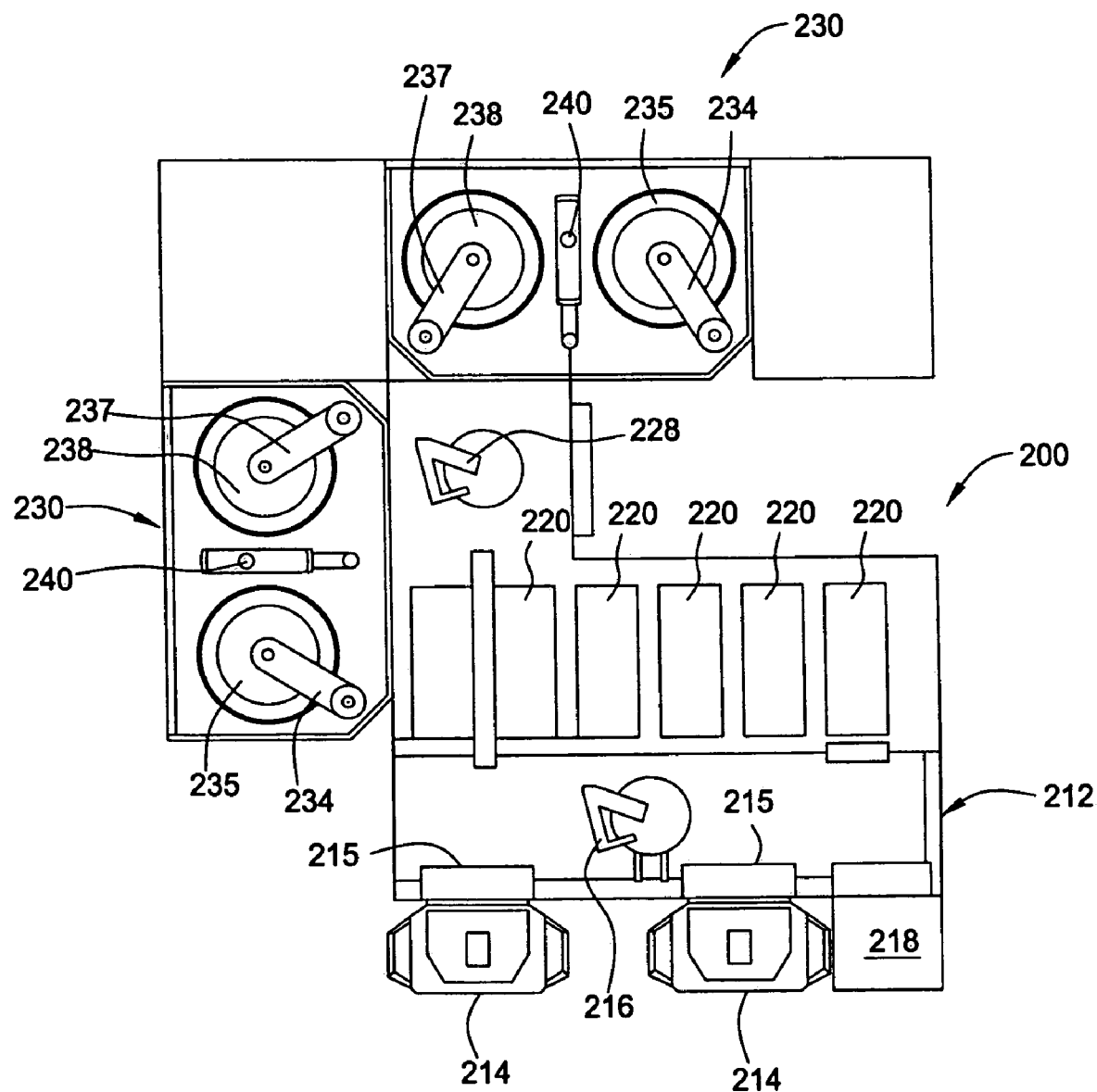
FIG. 3 is a schematic top view of another embodiment of an integrated processing system.

FIG. 3 is a schematic top view of another embodiment of an integrated processing system 200 which may be utilized to perform method 10 of FIG. 1. Integrated processing system 200 includes a factory interface 212, vertically disposed processing stations 220, one or more twin chambers 230, and an anneal chamber 218. The factory interface 212 includes a plurality of bays 215, each accepting a substrate storage cassette 214, and at least one robot 216 to transfer substrates (not shown) between the cassettes 214, the vertically disposed processing stations 220, and the anneal chamber 218. The anneal chamber 218 may comprise a thermal anneal chamber and/or may comprise a plasma anneal chamber.

The vertically disposed processing stations 220 are adapted to process substrates in a vertical orientation. At least one vertically disposed processing station 220 is an input/output station for the transfer of substrates to and from the factory interface 212 and to and from robot 228. The robot 228 transfer substrates between the vertically disposed process stations 220 and the one or more twin chambers 230. Each twin chamber 230 processes substrates in a horizontal orientation in a face-up position or a face-down position. Each twin chamber 230 may further include a first substrate carrier 234 to hold a substrate during processing in station 235 and a second substrate carrier 237 to hold a substrate during processing in station 238. Each twin chamber 230 may further include a transfer arm 240 to transfer a substrate between stations 235 and 238.

The vertically disposed processing stations 220 and stations 235, 238 of the twin chambers 230 may perform one or more processes such as wet cleaning, vapor drying, electroless deposition, activation, rinsing, bevel cleaning, spin-rinse drying, metrology inspection, electroplating, and/or other processes that may be beneficially used in conjunction with an electrochemical processing platform. In one example of a configuration for the integrated processing system 200 the vertically disposed processing stations 220 may perform pre-wet cleans and post-wet cleans and the stations 235, 238 may perform activation and/or electroless deposition.

Figure 4:
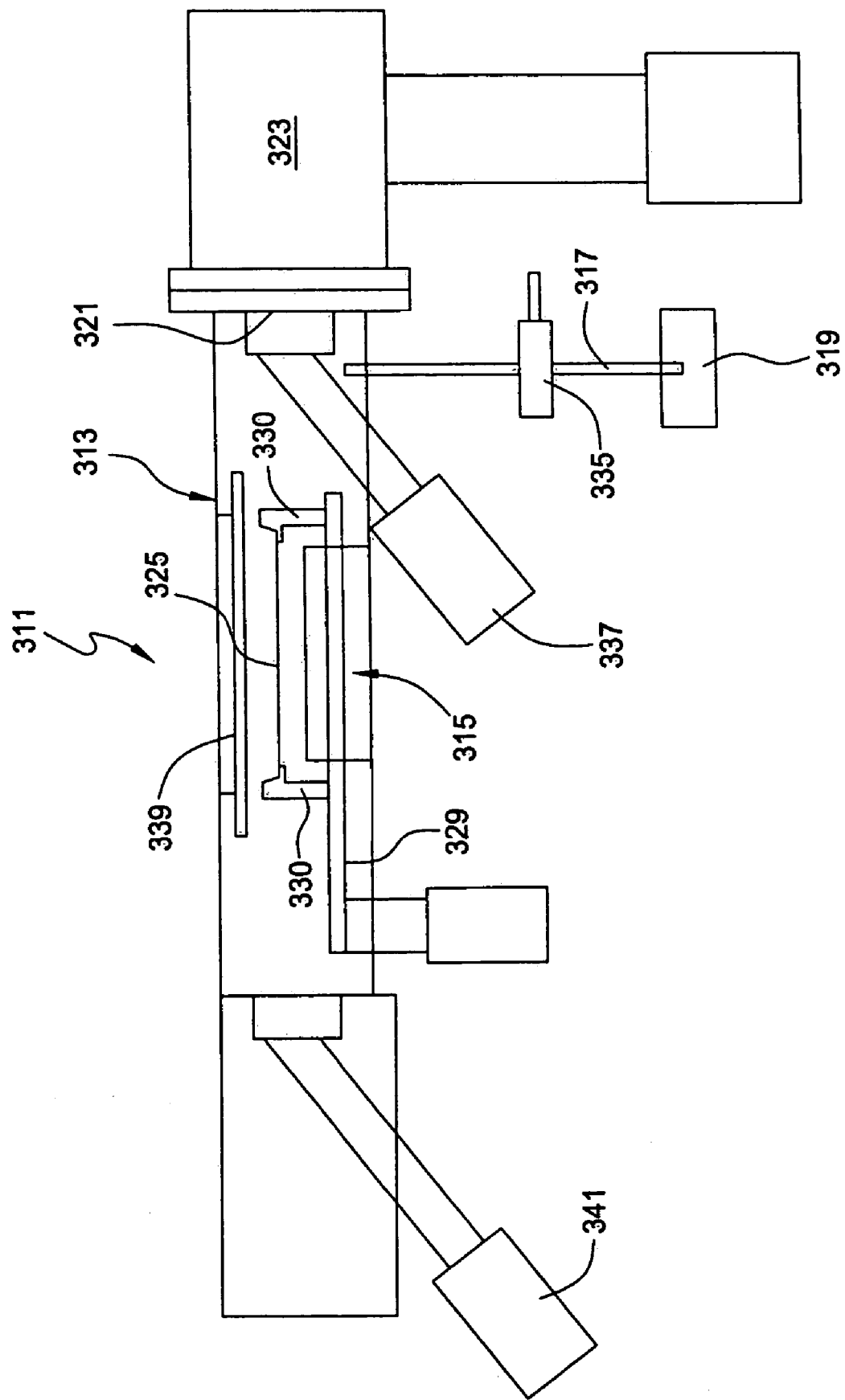
FIG. 4 is a schematic top perspective view of an exemplary thermal anneal chamber that utilizes a resistive heater to heat a substrate.

FIG. 4 is a schematic cross-sectional view of one embodiment of a thermal anneal chamber 311 that utilizes a resistive heater to heat a substrate. The thermal anneal chamber may be used as the anneal chamber 120 of FIG. 2 or the anneal chamber 218 of FIG. 3. The thermal anneal chamber 311 comprises a vacuum chamber 313 containing a heated substrate support 315 having a resistive heating element (not shown) embedded therein. Substrates may be transferred to and from the vacuum chamber 313 through a slit valve 341. A gas inlet 317 couples a gas source 319, such as, but not limited to, a noble gas, hydrogen gas, nitrogen gas, or combinations thereof, containing preferably less than 10 parts per million of general contaminants, such as water, oxygen, etc., in fluid communication with the vacuum chamber 313. The gas emitted from the gas source 319 may be further "dried" via a getter or cold trap (not shown) within the gas inlet 317. A gas outlet 321 couples the vacuum chamber 313 in fluid communication with a gas pump 323.

A substrate 325 may be mounted directly on the heated substrate support 315 or may be supported on a plurality of pins (not shown). In order to easily place and extract a substrate 325 from the heated substrate support 315, a substrate lift hoop 329 is employed. The substrate lift hoop 329 preferably is of the type having fingers 330 that extend under the substrate 325. Thus contact is limited to the area above the fingers 330.

The rate of the gas flowing into the vacuum chamber 313 is preferably controlled via a needle valve or flow controller 335 operatively coupled along the gas inlet 317. Preferably, the gas pump 323 comprises a cryo-pump and the gas outlet 321 comprises an isolation valve 337, such as slit valve or a gate valve, operatively coupled to the gas pump 323 to control the gas flow rate from the vacuum chamber 313. A reflector 339 is positioned in close proximity above the frontside of the substrate 325 such that heat radiating from the substrate 325 will reach the reflector 339 and be reflected back to the substrate 325. As an alternative to the reflector 339, a heater (not shown) may be placed in close proximity above the frontside of the substrate 325 such that heat radiating from the heater will reach the frontside of the substrate 325. Additional description of a thermal anneal chamber comprising a resistive heater may be found in commonly assigned U.S. Pat. No. 6,182,376, entitled "DEGASSING METHOD AND APPARATUS," issued Feb. 6, 2001, which is hereby incorporated by reference in its entirety to the extent not inconsistent herewith.

Figure 5:
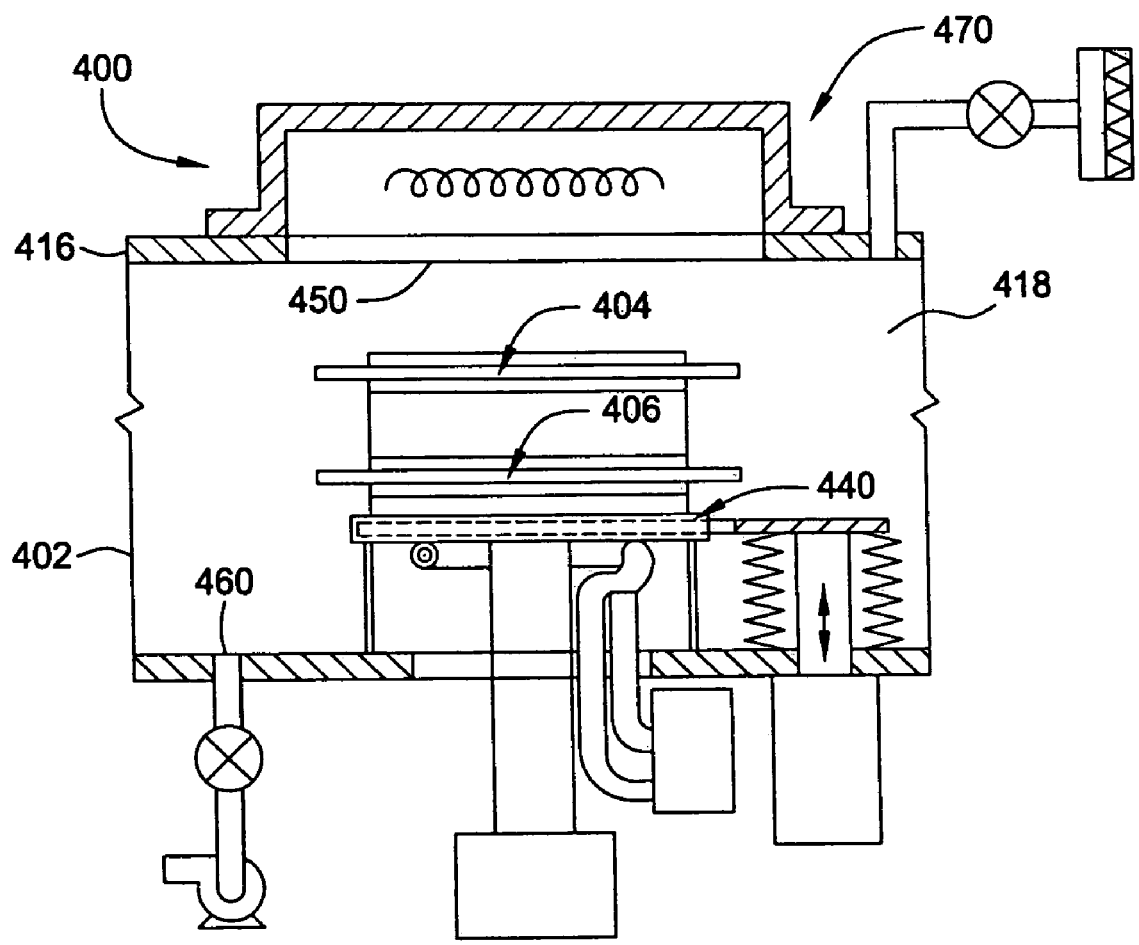
FIG. 5 is a schematic side cross-section view of an exemplary thermal anneal chamber that utilizes lamps to heat a substrate.

FIG. 5 is a schematic side cross-section view of an exemplary thermal anneal chamber 400 that utilizes lamps to heat a substrate. The thermal anneal chamber may be used as the anneal chamber 120 of FIG. 2 or the chamber 218 of FIG. 3. The thermal anneal chamber 400 generally comprises a chamber body 402 defining a chamber volume 418, one or more substrate holders 404, 406, a temperature control pedestal 440 and a lamp module 470. A window 450, typically comprised of quartz, is disposed in the top 416 of the chamber body 402 and is at least partially covered by the lamp module 470. In one embodiment, the lamp module 470 may comprise lamps providing a desired wavelength or wavelengths of radiation (i.e. such as UV radiation) in order to break or help to break the bonds of contaminants. The anneal chamber 400 comprises one or more exhausts 460 to control the pressure inside the chamber and to evacuate any desorbed or decomposed contaminants.

If more than one substrate holders is used, the substrate holders 404, 406 are concentrically coupled (i.e., stacked on top of each other). In one example, the anneal chamber 400 is capable of simultaneously heating a substrate positioned in the top substrate holder 404 while cooling a substrate positioned in the bottom substrate holder 406. Additional description of a thermal anneal chamber comprising a lamp heater may be found in commonly assigned U.S. Pat. No. 6,558,509, entitled "DUAL WAFER LOAD LOCK," issued May 6, 2003, which is hereby incorporated by reference in its entirety to the extent not inconsistent herewith.

Referring to FIG. 1, one embodiment of thermally annealing a substrate before electroless deposition in a thermal anneal chamber, such as in the thermal anneal chamber of FIG. 4 or FIG. 5, provides a gas to the chamber at predetermined pressure to the chamber. The thermal anneal chamber is substantially evacuated and then a gas is provided to the chamber to achieve a predetermined pressure. In one embodiment, the predetermined pressure is below atmospheric pressure, preferably less than about 200 Torr, more preferably less than about 10 Torr. For example, a gas may be provided to the chamber evacuated to a pressure below 1 Torr to create a pressure between about 3 Torr and about 10 Torr. Examples of suitable gases include a noble gas, a reducing gas such as, but not limited to, hydrogen gas or ammonia gas, a non-reducing gas such as, but not limited to, nitrogen gas, or combinations thereof. In one embodiment, a gas comprising primarily a noble gas, such as argon, can be flowed into the chamber to provide an environment substantially free of oxygen. In another embodiment, a gas comprising a noble gas and a reducing gas (such as a noble gas/reducing gas volume ratio between about 99:1 and about 90:10, preferably about 4% reducing gas) can be flowed into the chamber to provide a reducing environment to suppress oxide formation or to convert metal oxides to metals, such as copper oxides to copper. Reduction in the amount of copper oxide improves the resistance of the copper lines. For example, the noble gas may comprise argon and the reducing gas may comprise hydrogen gas. The substrate is heated in the thermal anneal chamber to a substrate temperature between about 200° C. and about 600° C., preferably between about 300° C. and about 400° C., and more preferably between about 325° C. and about 375° C. Thereafter, the chamber is evacuated to carry out the provided gas(es) and desorbed contaminants from the substrate.

Although not bound by theory, it is believed that thermal annealing helps to remove organic contaminants from the substrate, such as corrosion inhibitors. Corrosion inhibitors, such as benzotriazole, mercapto-benzotriazole, 5-methyl-1-benzotriazole, and other azole compounds, may be present on the substrate from prior steps such as chemical mechanical polishing steps and/or cleaning steps. Corrosion inhibitors remaining on the substrate may be detrimental to defect-free formation of material thereover by electroless deposition. It is believed that thermal annealing helps to evaporate organic contaminants from the substrate. For example, the boiling point at atmospheric pressure of benzotriazole is 350° C. Thus, at reduced pressures, benzotriazole begins to evaporate at temperatures lower than 350° C. In one aspect, it is believed that a thermal anneal provides more consistent removal of organic contaminants in comparison to prior methods, such as wet clean methods, since it is difficult to control the cleaning action of a solution from substrate to substrate. In another theory, it is believed that annealing helps to remove moisture from dielectric materials, especially from porous dielectric materials in which the pores act like a sponge and absorb moisture.

Figure 6:
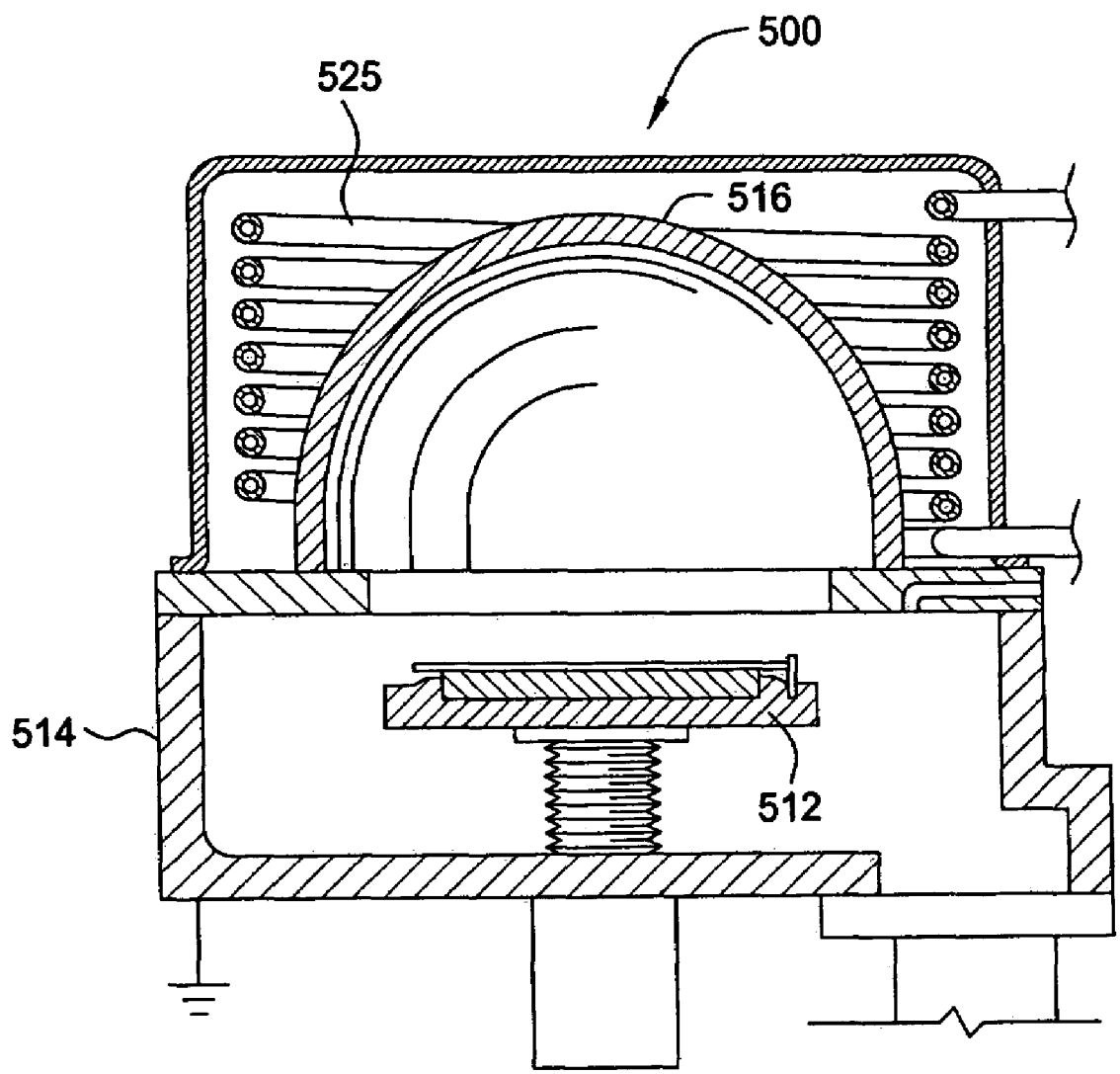
FIG. 6 is a schematic side cross-sectional view of an exemplary plasma anneal chamber.

FIG. 6 is a schematic side cross-sectional view of an exemplary plasma anneal chamber 500. The plasma anneal chamber 500 may be used as the anneal chamber 120 of FIG. 2 or the anneal chamber 218 of FIG. 3. Generally, the plasma anneal chamber 500 includes a substrate support 512 disposed in a chamber enclosure 514 under a quartz or dielectric dome 516. A plasma coil 525 surrounds the dome 516 to provide an inductively coupled plasma to the chamber enclosure 514. Alternatively, a remote plasma source may provide a plasma to the chamber enclosure 514.

Referring to FIG. 1, one embodiment of plasma annealing a substrate before electroless deposition in a plasma anneal chamber, such as in the plasma anneal chamber of FIG. 6, comprises providing a plasma from hydrogen gas, argon gas, helium gas, other suitable gases, or combinations thereof. For example, a substrate may be plasma annealed in a plasma from argon gas or from argon gas and hydrogen gas to provide etching of the substrate. In another embodiment, a substrate may be plasma annealed in helium and hydrogen plasma providing a reducing environment with less etching of the substrate. Suitable plasma annealing conditions include chamber pressures of from less than 1 mTorr to about 50 Torr, and chamber temperatures from about ambient temperature to about 400° C. In addition, the plasma may be generated remote to the chamber or in situ.

The present apparatuses and methods may be used to advantage in selective electroless deposition. Selective electroless deposition comprises electroless deposition of a material selectively over conductive features, such as copper features, without the need to remove the material over dielectric features. Contaminants remaining on either or both conductive features and the dielectric features may cause problems with selective electroless deposition thereover, such as selectivity problems, leakage problems, and other problems. The present process provides a consistent, production worthy technique to remove contaminants from the conductive features and dielectric features.

Figure 7B:
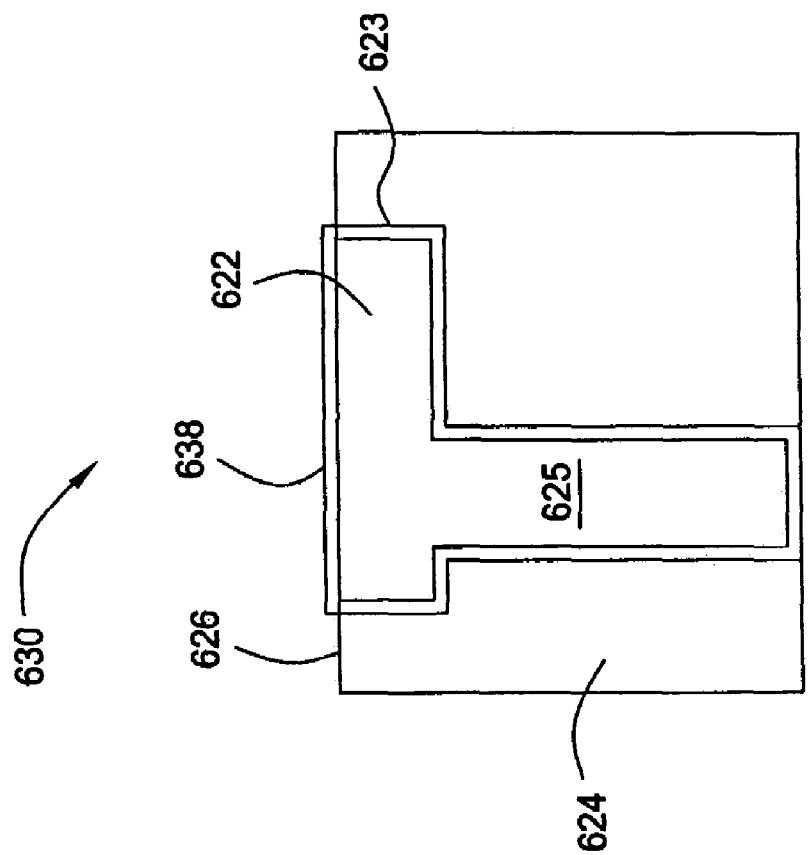
FIGS. 7A–7B is a schematic cross-section view of one example of an application of the method for use in selective electroless deposition of a capping layer.
Figure 7A:
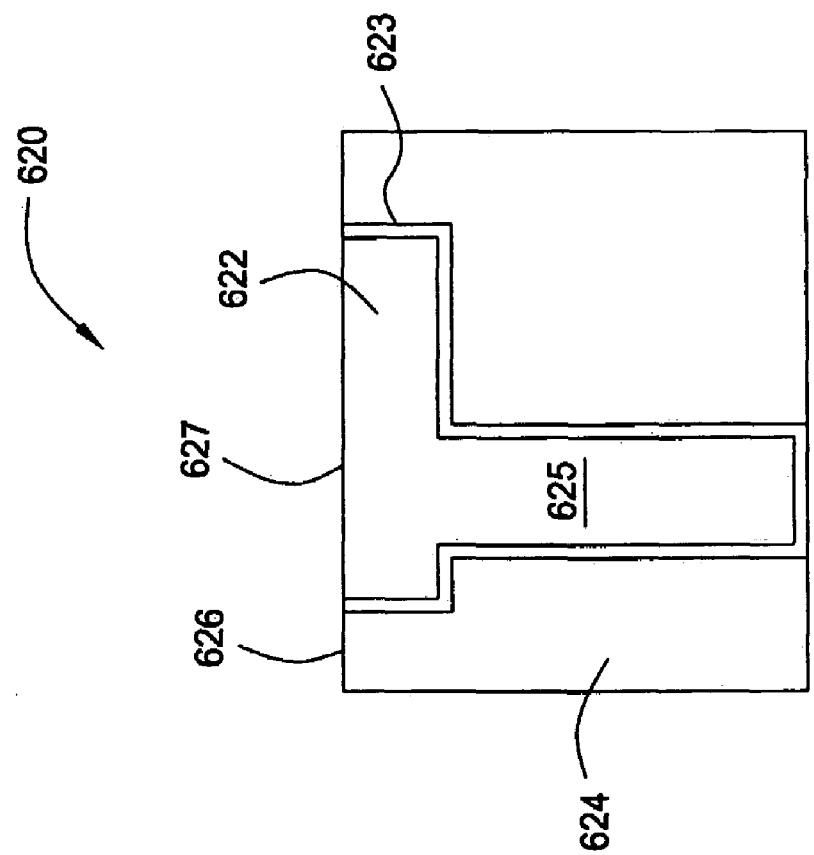

FIGS. 7A–7B are schematic cross-section views of one example of an application of the method 10 of FIG. 1 for use in selective electroless deposition of a capping layer. In other embodiments, the method 10 of FIG. 1 may be used in selective or non-selective electroless deposition of a seed layer, a fill layer, a barrier layer, or other layers.

FIG. 7A shows a substrate structure 620 after planarization by chemical mechanical polishing. The substrate structure 620 includes a dielectric layer 624 formed over a substrate (not shown), such as a semiconductor substrate or glass substrate, or formed over a substrate as well as other materials formed over the substrate. The dielectric layer 624 may comprise low-k dielectric materials, non low-k dielectric materials, and/or combinations thereof, such as a low-k material capped with TEOS.

The dielectric layer 624 includes an aperture 625, such as a via, trench, contact hole, or line. A barrier layer 623, such as a tantalum-containing barrier layer or other suitable barrier layer, is formed over the aperture 625. A copper layer 622 is formed over the barrier layer 623 filling the aperture 625. A seed layer (not shown), such as a copper seed layer or other suitable seed layer, may be formed between the barrier layer 623 and the copper layer 622 to help deposition of the copper layer 622. The copper layer 622, the optional seed layer, and the barrier layer 623 have been removed from the upper surface of the dielectric layer 624 through planarization techniques. Thus, the upper surface of the substrate structure 620 includes an exposed portion 626 of the dielectric layer 624 and an exposed portion 627 of the copper layer 622.

FIG. 7B shows a substrate structure 630, comprising substrate structure 620 after the annealing and electroless deposition of method 10 of FIG. 1 is performed thereover. Selective electroless deposition forms a selective electroless cap 638 over conductive surfaces, such as over the exposed portion 627 of the copper layer 622, but does not form a cap over the exposed portion 626 of the dielectric layer 624. Thus, subsequent patterning and etching steps are not required to remove the selective electroless cap from the dielectric layer 624.

Examples of possible capping materials include, but are not limited to, binary compounds of cobalt and phosphorus, cobalt and boron, and nickel and boron; ternary compounds of cobalt, tungsten, and phosphorus, cobalt, tungsten, and boron, and nickel, tungsten and boron; quaternary compounds of cobalt, tungsten, phosphorus, and boron; and combinations thereof. Preferably, the capping material comprises a binary compound of cobalt and phosphorus or cobalt and boron, a ternary compound of cobalt, tungsten, and phosphorus or cobalt, tungsten, and boron; a quaternary compound of cobalt, tungsten, phosphorus, and boron, or a combination thereof. In one aspect, the electroless cap 638 helps protect the copper layer 622 from oxidizing during subsequent processing steps. In another aspect, the electroless cap 638 helps prevent diffusion of copper into surrounding layers. In still another aspect, the electroless cap 638 helps prevent the formation and surface migration of copper vacancies. In yet another aspect, the electroless cap 638 makes the use of a passivation layer optional.

EXAMPLES

Planarized semiconductor substrates comprising a dielectric layer having copper features formed therein were provided. For a first sample of substrates, a thermal anneal was performed at a temperature of about 350° C. in a reduced pressure environment with a gas mixture provided in a ratio of about 96:4 (v/v) noble gas to hydrogen gas. Then, an electroless deposition was performed over the pretreated substrates to form a cobalt comprising cap selectively over the copper features. For a second sample of substrates, a fluid was provided to pretreat the substrates. Then, electroless deposition was performed over the substrates to form a cobalt comprising cap selectively over the copper features. In a third sample of substrates, an electroless deposition was performed over the substrates to form a cobalt comprising cap selectively over the copper features without a fluid pretreatment or a thermal anneal pretreatment. Electrical tests showed improved leakage current results of the cobalt-capped substrates that were pretreated with a thermal anneal in comparison to cobalt-capped substrates that were only fluid pretreated and in comparison to the cobalt-capped substrates that were neither fluid pretreated nor thermal anneal pretreated.

While the foregoing is directed to embodiments of the present invention, other and further embodiments of the invention may be devised without departing from the basic scope thereof, and the scope thereof is determined by the claims that follow.

The invention claimed is:

1. A method for processing a planarized substrate comprising exposed dielectric portions and exposed copper portions, comprising:
    annealing the exposed dielectric portions and exposed copper portions of the substrate at a reduced pressure while providing a gas selected from the group consisting of noble gases, hydrogen gas, other reducing gases, nitrogen gas, other non-reactive gases, and combinations thereof, wherein the gas is a combination of gases comprising at least about 1% to about 10% reducing gas by volume; and
    depositing a capping layer selectively over the exposed copper portions of the substrate by electroless deposition.

2. The method of claim 1, wherein the capping layer comprises a material selected from the group consisting of:
    binary compounds of cobalt and phosphorus, cobalt and boron, and nickel and boron;
    ternary compounds of cobalt, tungsten, and phosphorus, cobalt, tungsten, and boron, and nickel, tungsten and boron;
    quaternary compounds of cobalt, tungsten, phosphorus, and boron; and combinations thereof.

3. The method of claim 1, wherein the reducing gas is hydrogen gas.

4. The method of claim 1, wherein annealing comprises heating the substrate to a substrate temperature between about 200° C. and about 600° C.

5. The method of claim 1, wherein annealing comprises heating the substrate to a substrate temperature between about 300° C. and about 400° C.

6. The method of claim 1, wherein annealing comprises heating the substrate to a substrate temperature between about 325° C. and about 375° C.

7. The method of claim 1, wherein annealing comprises plasma annealing the substrate in a plasma.

8. The method of claim 1, wherein annealing comprises plasma annealing the substrate in a hydrogen plasma.

9. The method of claim 4, wherein the step of heating the substrate further comprises:
    removing organic contaminants from the exposed dielectric and copper portions on the substrate.

10. The method of claim 4, wherein the step of heating the substrate further comprises:
    removing corrosion inhibitors from the exposed dielectric and copper portions on the substrate.

11. The method of claim 4, wherein the substrate is heated with a resistive heater.

12. The method of claim 4, wherein the substrate is heated with a lamp.

13. The method of claim 4, wherein the substrate is heated with a lamp providing a certain wavelength or wavelengths of radiation to break the bonds of contaminants on the first material deposited on the substrate.

14. The method of claim 2, wherein the pressure of the annealing step is controlled below about 10 Torr.

15. The method of claim 2, wherein the pressure of the annealing step is controlled between about 3 Torr and about 10 Torr.

16. The method of claim 7, wherein the temperature of the plasma annealing step is controlled at about 400 degrees Celsius.

17. The method of claim 1, wherein the noble gas includes argon and helium.

18. The method of claim 17, wherein the gas provided for annealing is a gas mixture including argon gas and hydrogen gas.

19. The method of claim 1, wherein the gas provided for annealing is a gas mixture including the noble gas and the hydrogen gas having a volume ratio between about 99:1 and about 90:10.

* * * * *